US011279851B2

(12) United States Patent
Kong et al.

(10) Patent No.: US 11,279,851 B2
(45) Date of Patent: Mar. 22, 2022

(54) POLISHING SLURRY COMPOSITION

(71) Applicant: KCTECH CO., LTD., Gyeonggi-do (KR)

(72) Inventors: Hyungoo Kong, Gyeonggi-do (KR); Jinsook Hwang, Gyeonggi-do (KR); Sangmi Lee, Daegu (KR); Inseol Hwang, Gyeonggi-do (KR); Nara Shin, Gyeonggi-do (KR)

(73) Assignee: KCTECH CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/426,906

(22) Filed: May 30, 2019

(65) Prior Publication Data
US 2020/0002573 A1    Jan. 2, 2020

(30) Foreign Application Priority Data

Jun. 28, 2018 (KR) .................. 10-2018-0074567
Nov. 9, 2018 (KR) .................. 10-2018-0137610

(51) Int. Cl.
*C09G 1/02* (2006.01)
*H01L 21/321* (2006.01)

(52) U.S. Cl.
CPC ............ *C09G 1/02* (2013.01); *H01L 21/3212* (2013.01)

(58) Field of Classification Search
CPC .................. C09G 1/02; H01L 21/3212
See application file for complete search history.

(56) References Cited

U.S. PATENT DOCUMENTS

| | | | | |
|---|---|---|---|---|
| 9,834,705 | B2 * | 12/2017 | Park ...................... | C09K 3/1463 |
| 2003/0031766 | A1 * | 2/2003 | Lee ...................... | H05B 6/6458 |
| | | | | 426/231 |
| 2007/0190789 | A1 | 8/2007 | Carter | |
| 2007/0298612 | A1 * | 12/2007 | Dysard ............... | C09K 3/1463 |
| | | | | 438/689 |
| 2010/0167547 | A1 * | 7/2010 | Kamimura .......... | H01L 21/3212 |
| | | | | 438/693 |
| 2015/0053642 | A1 * | 2/2015 | Bulick .................... | C09G 1/02 |
| | | | | 216/38 |
| 2015/0267083 | A1 * | 9/2015 | Ward ....................... | C09G 1/02 |
| | | | | 438/693 |
| 2017/0009353 | A1 * | 1/2017 | Hwang .................... | C23F 3/06 |
| 2017/0015868 | A1 * | 1/2017 | Iwata ................... | C09K 3/1409 |
| 2018/0002571 | A1 * | 1/2018 | Stender ................ | C09K 3/1463 |
| 2019/0119422 | A1 * | 4/2019 | Sugawa ................... | C08K 3/32 |
| 2019/0352535 | A1 * | 11/2019 | Shi ...................... | H01L 21/31053 |
| 2020/0354609 | A1 * | 11/2020 | Kamimura .......... | H01L 21/3212 |

FOREIGN PATENT DOCUMENTS

| | | |
|---|---|---|
| CN | 1312345 A | 9/2001 |
| CN | 1379074 A | 11/2002 |
| CN | 1420917 A | 5/2003 |
| CN | 1650403 A | 8/2005 |
| CN | 1696235 A | 11/2005 |

(Continued)

*Primary Examiner* — Anita K Alanko
(74) *Attorney, Agent, or Firm* — Christensen, Fonder, Dardi & Herbert PLLC; John P. Fonder

(57) ABSTRACT

Provided is a polishing slurry composition including colloidal silica abrasive particles, a metal oxide monomolecular complexing agent, an oxidizer, and a pH adjusting agent, a water-soluble polymer, or both.

9 Claims, 1 Drawing Sheet

(56) References Cited

FOREIGN PATENT DOCUMENTS

| | | | |
|---|---|---|---|
| CN | 1860592 | A | 11/2006 |
| CN | 1939993 | A | 4/2007 |
| CN | 1966548 | A | 5/2007 |
| CN | 101345806 | A | 1/2009 |
| CN | 101370898 | A | 2/2009 |
| CN | 101410956 | A | 4/2009 |
| CN | 101541913 | A | 9/2009 |
| CN | 102768954 | A | 11/2012 |
| CN | 105839111 | A | 8/2016 |
| CN | 105983441 | A | 10/2016 |
| CN | 106336812 | A | 1/2017 |
| CN | 106366934 | A | 2/2017 |
| CN | 106398544 | A | 2/2017 |
| CN | 106661429 | A | 5/2017 |
| CN | 1291630 | A | 4/2018 |
| JP | 2004179294 | A | 6/2004 |
| JP | 2005064285 | A | 3/2005 |
| JP | 2005109257 | A | 4/2005 |
| JP | 2005328043 | A | 11/2005 |
| JP | 2006191131 | A | 7/2006 |
| JP | 2007123826 | A | 5/2007 |
| JP | 2007154176 | A | 6/2007 |
| JP | 2009161371 | A * | 7/2009 |
| JP | 2012056073 | A | 3/2012 |
| JP | 2017057398 | A | 3/2017 |
| KR | 20140005963 | A | 1/2014 |
| KR | 1020050006284 | B1 | 1/2015 |
| KR | 20160142995 | A * | 12/2016 ......... G06F 12/0886 |
| TW | 200916608 | A | 4/2009 |
| WO | 2007077886 | A1 | 7/2007 |
| WO | 2009017095 | A1 | 2/2009 |

\* cited by examiner

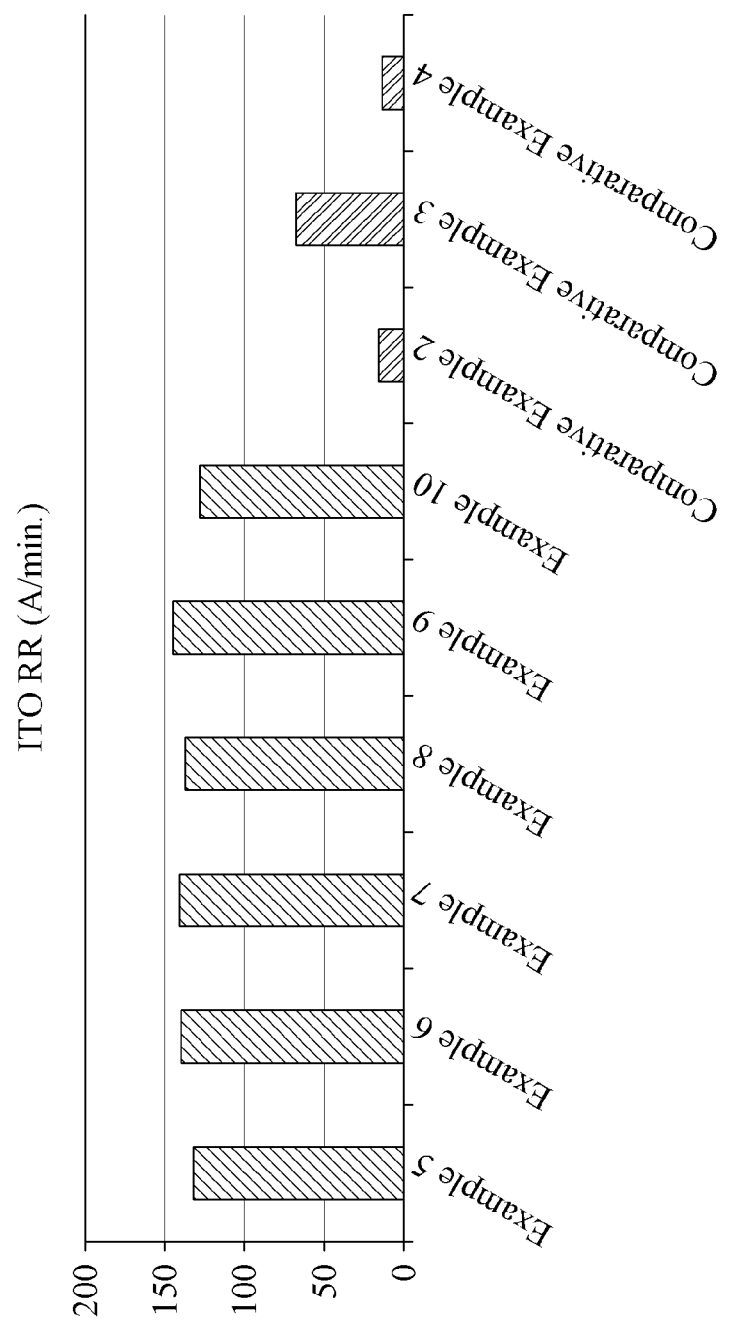

POLISHING SLURRY COMPOSITION

CROSS-REFERENCE TO RELATED APPLICATIONS

This application claims the benefit of Korean Patent Application No. 10-2018-0074567 filed on Jun. 28, 2018 and Korean Patent Application No. 10-2018-0137610 filed on Nov. 9, 2018, in the Korean Intellectual Property Office, the disclosures of which are incorporated herein by reference.

BACKGROUND

1. Field of the Invention

One or more example embodiments relate to a polishing slurry composition.

2. Description of the Related Art

Recently, there have been required a number of chemical mechanical polishing (CMP) processes for many thin films constituting devices in the field of semiconductor and display industries.

A CMP process refers to a process of smoothly polishing a surface of a semiconductor wafer using a slurry containing an abrasive and various compounds through a rotation movement while the surface of the semiconductor wafer is in contact with a polishing pad. In general, it is known that a metal polishing process is performed by repeating a process of forming a metal oxide ($MO_x$) by an oxidizer and a process of removing the formed metal oxide with abrasive particles.

A polishing process of a tungsten layer, which is widely used as a wiring of a semiconductor device, is also performed by a mechanism in which a process of forming a tungsten oxide ($WO_3$) by an oxidizer and a potential control agent and a process of removing the tungsten oxide with abrasive particles are repeated. Also, an insulation film or a pattern such as a trench may be formed under the tungsten layer. In this case, a high polishing selectivity between the tungsten layer and the insulation film is required in the CMP process. Thus, in order to improve the polishing selectivity of tungsten with respect to the insulation film, various components are added to a slurry, or amounts of an oxidizer and a catalyst to be contained in the slurry are controlled. However, in spite of such endeavor, a tungsten polishing slurry which implements a high polishing selectivity or improves a polishing performance by adjusting a desired polishing selectivity has not been developed yet.

Further, indium tin oxide (ITO), indium zinc oxide (IZO), or indium tin zinc oxide (ITZO) is widely used as an inorganic substance with high conductivity and light transmittance. This is used as a thin layer of ITO covering a substrate surface in a display device, a display substrate and panel such as an organic light emitting diode (OLED), a touch panel, a transparent electrode for a solar cell, or an antistatic film. In general, to deposit an ITO thin film on a substrate, physical vapor depositions such as DC-magnetron sputtering, RF-sputtering, ion beam sputtering and e-beam evaporation, and chemical vapor depositions such as sol-gel and spray pyrolysis are used. A thin film formed by DC-magnetron sputtering, which is most widely used among the above depositions, has a high surface roughness of more than Rrms 1 nm or more than Rpv 20 nm. Thus, when the thin film is applied to an organic light emitting diode, an organic substance is damaged due to a concentration of current density, which results in defects such as block spots. In conjunction with non-uniform scratches and surface residues (foreign substances adsorbed on the ITO surface) of the ITO thin film, a current leakage path through a diode adjacent to the ITO layer may be provided, which causes a crosstalk and a low resistance.

Attempts have been made to solve the issues mentioned above through planarization of the ITO film. Representatively, ion beam sputtering and ion plating are used. However, such ion assisted depositions may be used to deposit a thin film having a flat surface, but may be difficult to be applied to mass production due to a slow deposition rate and difficulties in increasing the area. Although suggested in a method of performing planarization by finely polishing a surface of a formed thin film, a planarization method by a rod member having a surface with abrasive ability, application of a liquid planarizing agent using surface modifier deposition, planarization etching, pressure planarization, and ablation, existing planarization processes by polishing, surface modifier deposition, and etching cause unwanted scratch defects or surface contamination on the surface of the ITO film after the planarization processes are performed.

An integrated circuit includes hundreds of active devices formed in or on a silicon support. Shorted active devices are interconnected to form a functional circuit, and respective layers of the active devices are connected by a multilevel interconnection scheme. Interconnect layers in the integrated circuit generally have a metallization level at which a first metal layer, an interconnect layer, a second metal layer, an interconnect layer, and a third metal layer are connected. Dielectrics, such as doped and undoped silicon dioxide (SiO2) used as interconnect layers, are also used to electrically short metal layers of different levels in the silicon support.

In manufacturing integrated circuits and other electronic devices, multiple layers of conductive, semi-conductive, and dielectric materials are deposited on a surface of a substrate or removed from the surface of the substrate. Thin layers of the conductive, semi-conductive, and dielectric materials may be deposited by a number of deposition techniques. Common deposition techniques in modern fabrication include physical vapor deposition (PVD) also known as sputtering, chemical vapor deposition (CVD), plasma enhanced chemical vapor deposition (PECVD), and electrochemical plating (ECP).

Because layers of materials are continuously deposited and removed, a top layer surface of the substrate may not be flat throughout the whole surface, and planarization is needed. Surface planarization, or surface "polishing" is a process of removing a material from a surface of a substrate to form a generally flat and even surface. Planarization is useful for removing undesirable surface shapes and surface defects such as rough surfaces, aggregated materials, crystal lattices, damaged areas, scratches and contaminated layers, or contaminated materials. Planarization is also useful for forming features on a substrate by filling the features for subsequent steps of metallization and fabrication and removing excessively deposited materials used to provide a flat surface.

It is known that a metal CMP process repeatedly performs a process of removing an oxide film formed by an oxidizer with abrasive particles. In order to improve a polishing rate, an oxidation process is accelerated, or a slurry is designed in view of an aspect of smoothly removing the formed oxide film. There is a method of easily increasing a polishing speed by increasing a concentration of an oxide which corrodes a metal. However, as a corrosion speed increases, corrosion occurs even at a portion where a wiring layer is to be formed for electrical characteristics of an element such as a seam or a contact part, and rather a reliability and a yield of the element may be reduced.

A process of removing the oxide film formed by the oxidizer contained in the slurry considers a physical action and a chemical action simultaneously. The physical part is mainly performed by the abrasive particles and relates to a concentration or size of the abrasive particles. When the concentration of the abrasive particles increases, the polishing speed also improves. However, a high concentration of the abrasive particles may result in detects such as scratches, degrade a dispersion stability of the slurry, and shorten a period of use. It is known that there is an appropriate range of the size of the abrasive particles, and an overly small or great size rather reduces the polishing speed.

SUMMARY

An aspect provides, to solve the foregoing issues, a polishing slurry composition including colloidal silica abrasive particles that may improve a surface planarization process of a thin film applied to a semiconductor device and a display device.

In detail, an aspect provides a polishing slurry composition including colloidal silica abrasive particles, an oxidizer, a metal oxide monomolecular complexing agent, and a water-soluble polymer.

An aspect provides a polishing slurry composition including colloidal silica abrasive particles, an oxidizer, a metal oxide monomolecular complexing agent, and a pH adjusting agent.

However, the problems to be solved in the present disclosure are not limited to the foregoing problems, and other problems not mentioned herein would be clearly understood by one of ordinary skill in the art from the following description.

According to an aspect, there is provided a polishing slurry composition including colloidal silica abrasive particles, a metal oxide monomolecular complexing agent, an oxidizer, and a pH adjusting agent, a water-soluble polymer, or both.

According to an aspect, there is provided a polishing slurry composition including colloidal silica abrasive particles, an oxidizer, a metal oxide monomolecular complexing agent, and a pH adjusting agent.

According to an aspect, there is provided a polishing slurry composition including colloidal silica abrasive particles, an oxidizer, a metal oxide monomolecular complexing agent, and a water-soluble polymer.

The colloidal silica abrasive particles may be included in the slurry composition in an amount of 0.0001 parts by weight to 20 parts by weight.

The colloidal silica abrasive particles may be included in the slurry composition in an amount of more than 0.5 parts by weight and less than or equal to 5 parts by weight.

The colloidal silica abrasive particles may range in size from 10 nm to 300 nm.

The colloidal silica abrasive particles may have a zeta potential of −1 mV to −100 mV at a pH of 1 to 12.

The colloidal silica abrasive particles may include particles with a single size of 10 nm to 300 nm or mixed particles with at least two different sizes of 10 nm to 300 nm.

The colloidal silica abrasive particles may include particles with a first size of 10 nm to 150 nm and a second size of 150 nm to 300 nm.

The metal oxide monomolecular complexing agent may include an organic acid, and the organic acid may include at least one of glyoxylic acid, citric acid, malic acid, maleic acid, malonic acid, oxalic acid, succinic acid, lactic acid, tartaric acid, adipic acid, pimelic acid, suberic acid, azelaic acid, sebacic acid, fumaric acid, acetic acid, butyric acid, capric acid, caproic acid, caprylic acid, glutaric acid, glycolic acid, formic acid, lauric acid, myristic acid, palmitic acid, phthalic acid, propionic acid, pyruvic acid, stearic acid, and valeric acid.

The metal oxide monomolecular complexing agent may be included in the slurry composition in an amount of 0.00001 parts by weight to 10 parts by weight.

The pH adjusting agent may include an acidic substance or a basic substance, the acidic substance may include at least one of nitric acid, hydrochloric acid, phosphoric acid, sulfuric acid, hydrofluoric acid, bromic acid, iodic acid, formic acid, malonic acid, maleic acid, oxalic acid, acetic acid, adipic acid, citric acid, propionic acid, fumaric acid, salicylic acid, pimelic acid, benzoic acid, succinic acid, phthalic acid, butyric acid, glutaric acid, glutamic acid, glycolic acid, lactic acid, aspartic acid, tartaric acid, and salts thereof, and the basic substance may include at least one of ammonium methyl propanol (AMP), tetra methyl ammonium hydroxide (TMAH), ammonium hydroxide, potassium hydroxide, sodium hydroxide, magnesium hydroxide, rubidium hydroxide, cesium hydroxide, sodium bicarbonate, sodium carbonate, imidazole, and salts thereof.

The polishing slurry composition may be applied to polishing of a thin film including at least one of a silicon oxide film, a metal film, a metal oxide film, and an inorganic oxide film.

The polishing slurry composition may be applied to a polishing process of a semiconductor device, a display device, or both.

The metal film and the metal oxide film may each include at least one of Indium (In), tin (Sn), silicon (Si), titanium (Ti), vanadium (V), gadolinium (Gd), gallium (Ga), manganese (Mn), iron (Fe), cobalt (Co), copper (Cu), zinc (Zn), zirconium (Zr), hafnium (Hf), aluminum (Al), niobium (Nb), nickel (Ni), chromium (Cr), molybdenum (Mo), tantalum (Ta), ruthenium (Ru), tungsten (W), neodymium (Nd), rubidium (Rb), gold (Au), and platinum (Pt).

The inorganic oxide film may include at least one of fluorine doped tin oxide (FTO, $SnO_2$:F), indium tin oxide (ITO), indium zinc oxide (IZO), indium gallium zinc oxide (IGZO), Al-doped ZnO (AZO), aluminum gallium zinc oxide (AGZO), indium zinc tin oxide (IZTO), indium aluminum zinc oxide (IAZO), indium gallium tin oxide (IGTO), antimony tin oxide (ATO), gallium zinc oxide (GZO), IZO nitride (IZON), $SnO_2$, ZnO, IrOx, RuOx, and NiO.

A target film may be polished using the polishing slurry composition at a speed of greater than or equal to 100 Å/min.

A degree of planarization of a surface of a target film after the target film is polished using the slurry composition may be less than or equal to 5%.

A transparency of a device after a target film is polished using the slurry composition may increase by 5% or more when compared to that before the target film is polished.

An oxide film may be polished using the polishing slurry composition at a polishing rate of 100 Å/min to 200 Å/min.

The metal oxide monomolecular complexing agent may have a pKa greater than 1.0 and less than or equal to 4.5.

The metal oxide monomolecular complexing agent may be an acidic compound having 2 to 5 carbon atoms, and include at least one functional group of a hydroxyl group (—OH), a carbonyl group (C=O), and carboxylic acid (—COOH), wherein the number of each of the at least one functional group may be greater than or equal to 2.

The metal oxide monomolecular complexing agent may be included in the polishing slurry composition in an amount of 0.1 parts by weight to 1.0 parts by weight.

The metal oxide monomolecular complexing agent may include at least one of malonic acid, tartaric acid, glyoxylic acid, oxalic acid, lactic acid, and glutaric acid.

An amount of the colloidal silica abrasive particles may be 1 part by weight to 10 parts by weight with respect to the slurry composition.

The oxidizer may include at least one of hydrogen peroxide, urea hydrogen peroxide, urea, percarbonate, periodic acid, periodate, perchloric acid, perchlorate, perbromic acid, perbromate, perboric acid, perborate, permanganic acid, permanganate, persulfate, bromate, chlorate, chlorite, chromate, iodate, iodic acid, ammonium peroxodisulfate, benzoyl peroxide, calcium peroxide, barium peroxide, sodium peroxide, and carbamide peroxide.

An amount of the oxidizer may be 0.5 parts by weight to 5 parts by weight with respect to the slurry composition.

The water-soluble polymer may include at least one of polyacrylic acid, polymethacrylic acid, polyethylene glycol, styrenesulfonic acid, 2-acrylamido-2-methylpropane sulfonic acid (AMPS), vinylsulfonic acid, vinylphosphonic acid, and polystyrene sulfonic acid.

An amount of the water-soluble polymer may be 1 ppm to 50 ppm.

Additional aspects of example embodiments will be set forth in part in the description which follows and, in part, will be apparent from the description, or may be learned by practice of the disclosure.

EFFECT

According to example embodiments, it is possible to provide a polishing slurry composition that may secure a sufficient polishing rate for each film to be polished by applying colloidal silica abrasive particles, and free or minimize scratch defects in a polishing process.

The polishing slurry composition may be applied to a planarization process of a semiconductor device and a display device through a chemical mechanical polishing (CMP) processes, in detail, a planarization process of an inorganic oxide film, and an inorganic oxide film used for the display device.

The polishing slurry composition may secure a degree of planarization and/or a transmittance of a semiconductor wiring device, a display substrate, or a panel requiring a planarization process of an oxide film, a metal film, and an inorganic oxide film, thereby increasing an efficiency for post-processing.

The polishing slurry composition may provide a polishing slurry composition that may ensure a sufficient polishing rate for each film to be polished by applying colloidal silica abrasive particles including primary particles and secondary particles of different sizes, and ensuring optical properties in a post-process by improving a haze and a roughness of a surface of the film to be polished after polishing, and improve a chemical polishing speed of a metal oxide by further including a metal complexing agent, thereby improving the polishing rate of the film to be polished.

BRIEF DESCRIPTION OF THE DRAWINGS

FIG. 1 is a graph illustrating polishing rates of slurry compositions prepared in Examples 5 through 10 and Comparative Examples 2 through 4 according to an example embodiment.

DETAILED DESCRIPTION

Hereinafter, example embodiments will be described in detail. However, the scope of the present application is not limited to the example embodiments.

The terminology used herein is for the purpose of describing particular examples only and is not to be limiting of the examples. As used herein, the singular forms "a," "an," and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which examples belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the example embodiments, a repeated description related thereto will be omitted. When it is determined detailed description related to a related known function or configuration they may make the purpose of the example embodiments unnecessarily ambiguous in describing the example embodiments, the detailed description will be omitted here.

Hereinafter, a polishing slurry composition according to one or more example embodiments will be described in detail with reference to examples set forth below. However, the one or more example embodiments are not limited thereto.

One or more example embodiments relate to a polishing slurry composition. The slurry composition may include colloidal silica abrasive particles, an oxidizer, a metal oxide monomolecular complexing agent, and a pH adjusting agent, a water-soluble polymer, or both.

The colloidal silica abrasive particles may be included in the slurry composition in an amount of 0.0001 parts by weight to 20 parts by weight, in an amount of 0.0001 parts by weight to 10 parts by weight, or in an amount of more than 0.5 parts by weight and less than or equal to 5 parts by weight. If within the range, the colloidal silica abrasive particles may improve a transparency and/or a degree of planarization after polishing is performed, and minimize imperfections such as a defect and a scratch.

The colloidal silica abrasive particles may refer to amorphous silica fine particles having a colloidal state which is a stable dispersion state in a fluid. The colloidal silica abrasive particles are applied to various application fields, for example, a binder for manufacturing inorganic paint, a heat-resistant and optical coating agent, and a chemical mechanical polishing (CMP) slurry.

The colloidal silica abrasive particles may simultaneously function as abrasive particles and function as an oxidizer for oxidizing a metal film in a polishing slurry composition. CMP may be classified, depending on a processing target and a purpose, as oxide CMP of forming an interlayer dielectric (ILD), metal CMP of forming a metal wire such as, for example, aluminum (Al), tungsten (W) or copper Cu, or shallow trench isolation (STI) CMP of improving an operational characteristic and a degree of integration by increasing an electrical insulating property between devices. Herein, silica abrasive particles used for oxide CMP may be used as a type of slurry principally used in oxide CMP, among the above CMP processes.

The colloidal silica abrasive particles may range in size from 10 nm to 300 nm. When the size of the particles is less than 10 nm, small particles are generated excessively, the planarity of a film to be polished decreases, and a polishing rate decreases due to an excess of defects occurring on the surface of the film to be polished. When the size of the particles exceeds 300 nm, monodispersibility may not be achieved, and it may be difficult to adjust a degree of planarization, a transparency, and a defect after mechanical polishing is performed. The size of the particles may refer to a diameter, a length, or a thickness depending on a shape of the particles.

The colloidal silica abrasive particles may include, to improve a dispersibility in a slurry, a polishing performance of the film to be polished, a degree of planarization, and a transparency, particles with a single size of 10 nm to 300 nm or mixed particles with at least two different sizes of 10 nm to 300 nm. For example, the colloidal silica abrasive particles may include particles with a first size (primary particles) of 10 nm to 150 nm or 10 nm to 40 nm and a second size (secondary particles) of 40 nm to 100 nm or 150 nm to 300 nm.

The shape of the colloidal silica abrasive particles may include at least one of a spherical shape, a rectangular shape, a needle shape, and a plate shape.

The colloidal silica abrasive particles may have a zeta potential of −1 mV to −100 mV at a pH of 1 to 12, a zeta potential of −10 mV to −70 mV at a pH of 1 to 6, or a zeta potential of −10 mV to −70 mV at a pH of 2.5 to 6. This results in a high zeta potential absolute value even in an acidic region, which leads to a high dispersion stability and an excellent polishing performance with respect to the film to be polished.

The colloidal silica abrasive particles may function as abrasive particles in the polishing slurry composition and function as an oxidizer which oxidizes a metal film at the same time.

The colloidal silica abrasive particles prepare a polishing slurry composition with a high dispersion stability. Further, the colloidal silica abrasive particles may implement a high polishing characteristic of accelerating oxidation of the film to be polished, for example, an inorganic oxide film to easily polish the inorganic oxide film, and minimize scratch defects, thereby improving a degree of planarization and a transparency of the inorganic oxide film such as an ITO film.

A method of preparing the colloidal silica abrasive particles is not particularly limited to a particle preparation method known in the art and may be, for example, a hydrothermal synthesis, a sol-gel process, a precipitation method, or a direct oxidation method.

When the particle size of the colloidal silica abrasive particles increases, the polishing rate may increase. However, in this example, a roughness may occur on a surface of a film to be polished, and a haze reduction may occur.

The size of the colloidal silica abrasive particles and the degree of aggregation thereof which varies depending on the size may be factors related to whether a scratch occurs on the surface of the film to be polished. In this example, when a ratio of the degrees of aggregation with respect to the primary particles and the secondary particles is controlled to an appropriate level, the roughness and the haze of the surface of the film after the polishing process is performed may improve, whereby a polishing slurry composition capable of ensuring optical properties in a subsequent process, and a polishing selectivity may also improve, whereby a time for the polishing process may be reduced, and the productivity may improve.

The colloidal silica particles of the primary particles and the secondary particles which are different in size may have different polishing characteristics depending on the particle size, and provide an enhanced action effect by suitably mixing the primary particles and the secondary particles.

The primary particles and the secondary particles may be self-assembled using a preferable method of controlling the ensemble structure and the properties of the abrasive particles, and the primary particles may be aggregated with each other to form the secondary particles.

When the colloidal silica abrasive particles have a specific surface area within a range of 10 $m^2/g$ to 150 $m^2/g$, the colloidal silica abrasive particles may have a relatively low porosity, and thus the polishing efficiency may improve.

The specific surface area of the colloidal silica abrasive particles may be measured by titration using NaOH.

The metal oxide monomolecular complexing agent may interact with the oxidizer, thereby improving a polishing result. The metal oxide monomolecular complexing agent may combine metal ions that may affect the surface roughness with a complex compound through surface complexation, thereby improving the surface roughness. Further, the metal oxide monomolecular complexing agent may be applied as a chelating agent.

The metal oxide monomolecular complexing agent may have a pKa greater than 1.0 and less than or equal to 4.5. The metal oxide monomolecular complexing agent may satisfy a pKa value of greater than 1.0 and less than or equal to 4.5, and simultaneously satisfy a carbon number of 2 to 5, and/or a polishing rate of greater than 100 Å/min with respect to an inorganic film.

The metal oxide monomolecular complexing agent may be an acidic compound having 2 to 5 carbon atoms, and include at least one functional group of a hydroxyl group (—OH), a carbonyl group (C═O), and carboxylic acid (—COOH), wherein the number of each of the at least one functional group may be greater than or equal to 2.

The metal oxide monomolecular complexing agent may interact with the oxidizer, thereby improving a polishing result.

The metal oxide monomolecular complexing agent may be an acidic compound, preferably, having a pKa greater than 1.0 and less than or equal to 4.5, and more preferably, having a pKa greater than 1.25 and less than or equal to 4.3 and simultaneously having 2 to 5 carbon atoms and a polishing rate greater than 100 Å/min with respect to an inorganic film.

The metal oxide monomolecular complexing agent satisfying all the conditions for the pKa, the carbon number, and the polishing rate with respect to the inorganic film may combine metal ions that may affect the surface roughness with a complex compound through surface complexation, thereby improving the surface roughness.

The metal oxide monomolecular complexing agent may exhibit a relatively high current density value when a potentiodynamic polarization curve is drawn with respect to an amount of the oxidizer through an electrochemical analysis. This may be construed that polishing by oxidization occurs actively since a corrosion speed increases when the current density value increases.

The metal oxide monomolecular complexing agent may include at least one functional group of a hydroxyl group (—OH), a carbonyl group (C=O), and carboxylic acid (—COOH), wherein the number of each of the at least one functional group may be greater than or equal to 2, and wherein the functional group has an acidity since oxygen having a high electronegativity attracts electrons.

When the metal oxide monomolecular complexing agent is used, CMP polishing may be continued and continuously chelate metal oxides that are continuously generated, whereby readsorption of the metal oxides to a metal layer to be polished again may be continuously prevented.

The metal oxide monomolecular complexing agent may include at least one of glyoxylic acid, citric acid, malic acid, maleic acid, malonic acid, oxalic acid, succinic acid, lactic acid, tartaric acid, adipic acid, pimelic acid, suberic acid, azelaic acid, sebacic acid, fumaric acid, acetic acid, butyric acid, capric acid, caproic acid, caprylic acid, glutaric acid, glycolic acid, formic acid, lauric acid, myristic acid, palmitic acid, phthalic acid, propionic acid, pyruvic acid, stearic acid, and valeric acid.

The metal oxide monomolecular complexing agent may include at least one of malonic acid, tartaric acid, glyoxylic acid, oxalic acid, lactic acid, and glutaric acid.

The metal oxide monomolecular complexing agent may be included in the slurry composition in an amount of 0.00001 parts by weight to 10 parts by weight, in an amount of 0.01 parts by weight to 5 parts by weight, or in an amount of 0.1 parts by weight to 1.0 parts by weight, and secure the particle dispersibility and the stability of the slurry composition, increase an interaction or reaction effect with the oxidizer while maintaining a stability in the polishing slurry composition, and thereby form a uniform oxide film, if within the range.

The metal oxide monomolecular complexing agent may prevent a degradation of the polishing rate and the surface roughness when passive layers are excessively generated due to an oxidization occurring in response to the oxidizer facilitating polishing by oxidizing a metal surface.

When the metal oxide monomolecular complexing agent is used, the polishing speed may continuously increase, and surface defects may be reduced.

The metal oxide monomolecular complexing agent may be used solely, or used together with an auxiliary complexing agent.

The pH adjusting agent is to prevent corrosion of the film to be polished or corrosion of a polishing machine and to implement a pH range suitable for the polishing performance.

The pH adjusting agent may include an acidic substance or a basic substance. The acidic substance may include at least one of nitric acid, hydrochloric acid, phosphoric acid, sulfuric acid, hydrofluoric acid, bromic acid, iodic acid, formic acid, malonic acid, maleic acid, oxalic acid, acetic acid, adipic acid, citric acid, propionic acid, fumaric acid, salicylic acid, pimelic acid, benzoic acid, succinic acid, phthalic acid, butyric acid, glutaric acid, glutamic acid, glycolic acid, lactic acid, aspartic acid, tartaric acid, and salts thereof. The basic substance may include at least one of ammonium methyl propanol (AMP), tetra methyl ammonium hydroxide (TMAH), ammonium hydroxide, potassium hydroxide, sodium hydroxide, magnesium hydroxide, rubidium hydroxide, cesium hydroxide, sodium bicarbonate, sodium carbonate, imidazole, and salts thereof.

The oxidizer may include at least one of hydrogen peroxide, urea hydrogen peroxide, urea, percarbonate, periodic acid, periodate, perchloric acid, perchlorate, perbromic acid, perbromate, perboric acid, perborate, permanganic acid, permanganate, persulfate, bromate, chlorate, chlorite, chromate, iodate, iodic acid, ammonium peroxodisulfate, benzoyl peroxide, calcium peroxide, barium peroxide, sodium peroxide, and carbamide peroxide.

The oxidizer may be included in the slurry composition in an amount of 0.005 parts by weight to 10 parts by weight, in an amount of 0.05 parts by weight to 5 parts by weight, or in an amount of 0.5 parts by weight to 5 parts by weight. If within the range, a polishing speed suitable for the film to be polished may be provided, and surface hardening, erosion occurrence, and corrosion of the film to be polished caused by an increase in the oxidizer content may be prevented.

The water-soluble polymer may include at least one of polyacrylic acid, polymethacrylic acid, polyethylene glycol, styrenesulfonic acid, 2-acrylamido-2-methylpropane sulfonic acid (AMPS), vinylsulfonic acid, vinylphosphonic acid, and polystyrene sulfonic acid.

The water-soluble polymer may preferably include polyacrylic acid, polystyrene sulfonic acid, or both.

The water-soluble polymer may work together with another additive to adjust a selectivity with respect to the film to be polished.

An amount of the water-soluble polymer may be 1 ppm to 50 ppm.

When the amount of the water-soluble polymer is less than 1 ppm, an amount of the additive is low and there is little action of the additive. When more than 50 ppm of the water-soluble polymer is used, another type of additive added together may not function property.

Thus, it may be difficult to adjust the selectivity.

A pH of the polishing slurry composition may be adjusted to provide the dispersion stability and the suitable polishing speed depending on abrasive particles. The pH of the polishing slurry composition may have an acidic pH range of 1 to 12, preferably, 1 to 6.

The polishing slurry composition may have a zeta potential of −1 mV to −100 mV, preferably, a zeta potential of −10 mV to −70 mV. When an absolute value of the zeta potential is great, the particles have strong forces pushing each other and are not aggregated well. Thus, the polishing slurry composition may exhibit a high zeta potential absolute value even in an acidic region, and thus implement a high dispersion stability and an excellent polishing performance.

The polishing slurry composition may be applied to a polishing process of a semiconductor device, a display device, or both.

The polishing slurry composition may be applied to a planarization process of a semiconductor device and a display device for a film to be polished, that is, a thin film including at least one of an insulation film, a metal film, a metal oxide film, and an inorganic oxide film.

For example, the polishing slurry composition may be applied to a planarization process of a semiconductor device to which the insulation film, the metal film, the metal oxide film, and/or the inorganic oxide film is applied and a display device to which the inorganic oxide film is applied.

The insulation film may be a silicon or silicon oxide film, and the metal film and the metal oxide film may each include at least one of Indium (In), tin (Sn), silicon (Si), titanium (Ti), vanadium (V), gadolinium (Gd), gallium (Ga), manganese (Mn), iron (Fe), cobalt (Co), copper (Cu), zinc (Zn), zirconium (Zr), hafnium (Hf), aluminum (Al), niobium (Nb), nickel (Ni), chromium (Cr), molybdenum (Mo), tantalum (Ta), ruthenium (Ru), tungsten (W), neodymium (Nd), rubidium (Rb), gold (Au), and platinum (Pt).

The inorganic oxide film may include an oxide, a nitride, or both including at least one of Indium (In), tin (Sn), silicon (Si), titanium (Ti), vanadium (V), gadolinium (Gd), gallium (Ga), manganese (Mn), iron (Fe), cobalt (Co), copper (Cu), zinc (Zn), zirconium (Zr), hafnium (Hf), aluminum (Al), niobium (Nb), nickel (Ni), chromium (Cr), molybdenum (Mo), tantalum (Ta), ruthenium (Ru), tungsten (W), antimony (Sb), and iridium (Ir), and may be doped with halogen. For example, the inorganic oxide film may include at least one of fluorine doped tin oxide (FTO, $SnO_2$:F), indium tin oxide (ITO), indium zinc oxide (IZO), indium gallium zinc oxide (IGZO), Al-doped ZnO (AZO), aluminum gallium zinc oxide (AGZO), Ga-doped ZnO (GZO), indium zinc tin oxide (IZTO), indium aluminum zinc oxide (IAZO), indium gallium tin oxide (IGTO), antimony tin oxide (ATO), gallium zinc oxide (GZO), IZO nitride (IZON), $SnO_2$, ZnO, IrOx, RuOx, and NiO. The inorganic oxide film may preferably include ITO.

The planarization process of the semiconductor device and the display device may be further applied to nitride films of elements including at least one of Indium (In), tin (Sn), silicon (Si), titanium (Ti), vanadium (V), gadolinium (Gd), gallium (Ga), manganese (Mn), iron (Fe), cobalt (Co), copper (Cu), zinc (Zn), zirconium (Zr), hafnium (Hf), aluminum (Al), niobium (Nb), nickel (Ni), chromium (Cr), molybdenum (Mo), tantalum (Ta), ruthenium (Ru), tungsten (W), antimony (Sb), and iridium (Ir), for example, a nitride film such as a SiN film, high-permittivity films such as Hf-based, Ti-based, and Ta-based oxide films, semiconductor films such as silicon, amorphous silicon, SiC, SiGe, Ge, GaN, GaP, GaAs, and organic semiconductor films, phase change films of a GeSbTe film, and polymer resin films such as polyimide-based, polybenzoxazole-based, acrylic-based, epoxy-based, and phenol-based films.

The display device may be a substrate or a panel, a TFT, or an organic electroluminescent display device.

The polishing slurry composition may be further applied to a polishing process of a substrate including at least one of glass, silicon, SiC, SiGe, Ge, GaN, GaP, GaAs, sapphire, and plastic.

The film to be polished may be polished using the polishing slurry composition at a speed of greater than or equal to 100 Å/min, greater than or equal to 500 Å/min, or greater than or equal to 1000 Å/min. For example, an oxide film may be polished using the polishing slurry composition at a polishing rate of 100 Å/min to 200 Å/min.

The polishing rate may be determined by measuring a thickness of the oxide film with a polished wafer thin film coating thickness gauge. The polishing rate may be a value obtained by measuring [thickness of wafer before polishing−thickness of wafer after polishing]/1 min. When the polishing rate is less than 100 Å/min, a sufficient polishing rate and a selectivity thus achieved may not be supported, and a quality deterioration may occur. When the polishing rate exceeds A/min, there is a possibility of overetching.

A degree of planarization of a surface of the film to be polished after polishing is performed using the slurry composition may be less than or equal to 5%.

After the film to be polished is polished using the polishing slurry composition, a peak to valley (PV) value of the surface thereof may be less than or equal to 100 nm, and a roughness of the surface thereof may be less than or equal to 10 nm. The PV value and a degree of the roughness may be measured using a scanning probe microscopy.

A transparency of a device after the film to be polished is polished using the slurry composition may increase by 5% or more.

Hereinafter, the example embodiments will be described in detail with reference to the following examples and comparative example. However, the technical idea of the present invention is not limited thereto.

Example 1: Polishing Slurry Composition Including Colloidal Silica Abrasive Particles A polishing slurry composition of pH 2.5 was prepared by adding 4 wt % of colloidal silica abrasive particles, 0.5 wt % of hydrogen peroxide as an oxidizer, 0.1 wt % of malonic acid as a metal oxide monomolecular complexing agent, and nitric acid as a pH adjusting agent.

Example 2: Polishing Slurry Composition Including Colloidal Silica Abrasive Particles A polishing slurry composition was prepared in the same manner as in Example 1, except that 1.00 wt % of the metal oxide monomolecular complexing agent was contained.

Example 3: Polishing Slurry Composition Including Colloidal Silica Abrasive Particles A polishing slurry composition was prepared in the same manner as in Example 1, except that 6 wt % of the colloidal silica abrasive particles and 0.07 wt % of the metal oxide monomolecular complexing agent were contained.

Example 4: Polishing Slurry Composition Including Colloidal Silica Abrasive Particles A polishing slurry composition was prepared in the same manner as in Example 1, except that 0.5 wt % of the colloidal silica abrasive particles and 0.5 wt % of the metal oxide monomolecular complexing agent were contained.

Comparative Example 1: Polishing Slurry Composition Including Silica Abrasive Particles A polishing slurry composition was prepared in the same manner as in Example 1, except that colloidal silica abrasive particles available on the market were used and that 2 wt % of the abrasive particles were applied without applying a metal oxide monomolecular complexing agent.

(1) Evaluation of Dispersion Stability (Change in Zeta Potential)

To evaluate the dispersion stabilities of the abrasive particles of Example 1 and Comparative Example 1, initial zeta potentials of the abrasive particles of Example 1 and Comparative Example 1 and their zeta potentials after 10 days were compared. Table 1 shows a result of comparing the initial zeta potentials of the abrasive particles of Example 1 and Comparative Example 1 and their zeta potentials after 10 days.

TABLE 1

|  | Initial zeta potential (mV) | Zeta potential (mV) after 10 days | Remarks |
|---|---|---|---|
| Example 1 | −21.5 | −18.2 | Stable |
| Comparative Example 1 | +1.5 | +0.2 | Aggregated |

Referring to Table 1, it may be verified that the colloidal silica abrasive particles exhibited a high zeta potential absolute value even after 10 days and thus, have a high dispersion stability when compared to the abrasive particles of Comparative Example 1.

(2) Evaluation of Polishing Characteristics

An ITO film containing substrate was polished using the polishing slurry compositions of the examples and the comparative example under the polishing conditions as described below.

[Polishing Conditions]
1. Polishing device: CETR CP-4 of Bruker
2. Wafer: 6 cm×6 cm ITO film transparent substrate
3. Platen pressure: 3 psi
4. Spindle speed: 69 rpm
5. Platen speed: 70 rpm
6. Flow rate: 100 ml/min To evaluate the polishing characteristics, polishing speeds and degrees of planarization after the ITO film substrate was polished using the polishing slurry compositions of the examples and the comparative example were compared. Table 2 shows the polishing speeds and the degrees of planarization after the ITO film substrate was polished using the polishing slurry compositions of the examples and the comparative example.

TABLE 2

|  | Abrasive particles type | Abrasive particles content (wt %) | Metal oxide monomolecular complexing agent content (wt %) | Polishing speed (Å/min) | Degree of planarization (%) | Transparency change (After polishing/Before polishing) |
|---|---|---|---|---|---|---|
| Example 1 | Colloidal silica | 4.0 | 0.10 | 521 | 4 | +13 |
| Example 2 | Colloidal silica | 4.0 | 1.00 | 601 | 2 | +16 |
| Example 3 | Colloidal silica | 6.0 | 0.07 | 659 | 3 | +18 |
| Example 4 | Colloidal silica | 0.5 | 0.50 | 493 | 4 | +14 |
| Comparative Example 1 | Silica | 2.0 | 0.00 | 52 | 17 | +2 |

Referring to Table 2, it may be verified that when using the polishing slurry compositions, of Examples 1 through 4, to which the colloidal silica was applied, the polishing speeds and the degrees of planarization with respect to an ITO film were all excellent, and scratch defects were minimized, whereby the transparencies of the substrate improved.

Example 5

A polishing slurry composition was prepared by adding 0.5% of colloidal silica abrasive particles as an abrasive material, 0.5% of hydrogen peroxide as an oxidizer, and 0.5 wt % of malonic acid (pKa 2.8) as a metal oxide complexing agent having 2 to 5 carbon atoms and a pKa less than or equal to 4.5, 2.5 ppm of polyacrylic acid and polystyrene sulfonic acid as water-soluble polymers.

Example 6

A polishing slurry composition was prepared in the same manner as in Example 1, except that tartaric acid (pKa 2.9) was added, instead of malonic acid, as a metal oxide complexing agent having 2 to 5 carbon atoms and a pKa less than or equal to 4.5.

Example 7

A polishing slurry composition was prepared in the same manner as in Example 1, except that glyoxylic acid (pKa 3.18) was added, instead of malonic acid, as a metal oxide complexing agent having 2 to 5 carbon atoms and a pKa less than or equal to 4.5.

Example 8

A polishing slurry composition was prepared in the same manner as in Example 1, except that oxalic acid (pKa 1.25), instead of malonic acid, as a metal oxide complexing agent having 2 to 5 carbon atoms and a pKa less than or equal to 4.5.

Example 9

A polishing slurry composition was prepared in the same manner as in Example 1, except that lactic acid (pKa 3.83), instead of malonic acid, as a metal oxide complexing agent having 2 to 5 carbon atoms and a pKa less than or equal to 4.5.

Example 10

A polishing slurry composition was prepared in the same manner as in Example 1, except that glutaric acid (pKa 4.3), instead of malonic acid, as a metal oxide complexing agent having 2 to 5 carbon atoms and a pKa less than or equal to 4.5.

Comparative Example 2

An experiment was performed under the same condition as in Example 1, except that the metal oxide monomolecular complexing agent was not added.

Comparative Example 3

A polishing slurry composition was prepared in the same manner as in Comparative Example 1, except that 0.5 wt % of citric acid was added as a metal oxide monomolecular complexing agent.

Comparative Example 4

A polishing slurry composition was prepared in the same manner as in Comparative Example 1, except that 0.5 wt % of isonicotinic acid was added as a metal oxide monomolecular complexing agent.

Polishing rates were measured after oxide films were polished using the slurry compositions of Examples 5 through 10 and Comparative Examples 2 through 4. The oxide films were polished under the conditions of Feeding rate: 300 ml, Pressure: 4 psi, and Polishing Time: 1 min.

In detail, the content of the polishing rate measurement with respect to pKa, carbon number, and inorganic film which are characteristics of the metal oxide monomolecular complexing agents used in Examples 5 through 10 and Comparative Examples 2 through 4 is shown in Table 3.

TABLE 3

| Item | Chemical | pKa | C number | ITO RR (Å/min) |
|---|---|---|---|---|
| Example 5 | Maionic acid | 2.8 | 3 | 133 |
| Example 6 | Tartaric acid | 2.9 | 4 | 140 |
| Example 7 | Glyoxylic acid | 3.18 | 2 | 142 |
| Example 8 | Oxalic acid | 1.25 | 2 | 138 |
| Example 9 | Lactic acid | 3.83 | 2 | 146 |
| Example 10 | Glutaric acid | 4.3 | 5 | 128 |
| Comparative Example 2 | — | — | — | 17 |
| Comparative Example 3 | Citric acid | 3.13 | 6 | 68 |
| Comparative Example 4 | Isonicotinic acid | 4.96 | 6 | 14 |

It may be verified that the slurry compositions prepared in Examples 5 to 10 exhibited improved polishing rates since the metal oxide monomolecular complexing agent added in an appropriate amount interacted with the oxidizer.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:
1. A polishing slurry composition, comprising:
colloidal silica abrasive particles;
a metal oxide complexing agent;
an oxidizer; and
a pH adjusting agent, a water-soluble polymer, or both,
wherein the metal oxide complexing agent is an acidic compound having 2 to 5 carbon atoms, and includes at least one functional group selected from the group consisting of a hydroxyl group (—OH), a carbonyl group (C=O), and carboxylic acid (—COOH),
wherein the number of each of the at least one functional group is greater than or equal to 2,
wherein the metal oxide complexing agent includes at least one selected from the group consisting of malonic acid, tartaric acid, glyoxylic acid, oxalic acid, and glutaric acid,
wherein the metal oxide complexing agent is included in the slurry composition in an amount of 0.1 parts by weight (wt %) to 10 parts weight %,
wherein an amount of the water-soluble polymer is 1 ppm to 50 ppm,
wherein the water-soluble polymer includes polyacrylic acid and polystyrene sulfonic acid,
wherein the colloidal silica abrasive particles have a zeta potential of −1 mV to −100 mV at a pH of 1 to 12,
wherein the metal oxide complexing agent has a pKa greater than 1.0 and less than or equal to 4.5,
wherein the polishing slurry composition is designed and formulated for a thin film including an inorganic oxide film,
wherein the inorganic oxide film includes at least one selected from the group consisting of fluorine doped tin oxide (FTO, $SnO_2$: F), indium tin oxide (ITO), indium zinc oxide (IZO), indium gallium zinc oxide (IGZO), Al-doped ZnO (AZO), aluminum gallium zinc oxide (AGZO), indium zinc tin oxide (IZTO), indium aluminum zinc oxide (IAZO), indium gallium tin oxide (IGTO), antimony tin oxide (ATO), gallium zinc oxide (GZO), IZO nitride (IZON), $SnO_2$, ZnO, IrOx, RuOx, and NiO,
wherein the polishing slurry composition is designed and formulated to provide and increase a transparency of a device after a target film of 5% or more when compared to that before the target film is polished, and
wherein the colloidal silica abrasive particles have a specific surface area within a range of 10 $m^2$/g to 150 $m^2$/g and comprise a first size having a diameter of 10 nm to 150 nm and a second size having a diameter of 250 nm to 300 nm.

2. The polishing slurry composition of claim 1, wherein the colloidal silica abrasive particles are included in the slurry composition in an amount of 0.0001 parts by weight (wt %) to 20 parts weight %.

3. The polishing slurry composition of claim 1, wherein an amount of the oxidizer is 0.5 wt % to 5 wt % of a total amount of the slurry composition.

4. The polishing slurry composition of claim 1, wherein the oxidizer includes at least one selected from the group consisting of hydrogen peroxide, urea hydrogen peroxide, urea, percarbonate, periodic acid, periodate, perchloric acid, perchlorate, perbromic acid, perbromate, perboric acid, perborate, permanganic acid, permanganate, persulfate, bromate, chlorate, chlorite, chromate, iodate, iodic acid, ammonium peroxodisulfate, benzoyl peroxide, calcium peroxide, barium peroxide, sodium peroxide, and carbamide peroxide.

5. The polishing slurry composition of claim 1, wherein the pH adjusting agent includes an acidic substance or a basic substance,
the acidic substance includes at least one selected from the group consisting of nitric acid, hydrochloric acid, phosphoric acid, sulfuric acid, hydrofluoric acid, bromic acid, iodic acid, and salts thereof, and
the basic substance includes at least one selected from the group consisting of ammonium methyl propanol (AMP), tetra methyl ammonium hydroxide (TMAH), ammonium hydroxide, potassium hydroxide, sodium hydroxide, magnesium hydroxide, rubidium hydroxide, cesium hydroxide, sodium bicarbonate, sodium carbonate, imidazole, and salts thereof.

6. The polishing slurry composition of claim 1, wherein the water-soluble polymer further includes at least one selected from the group consisting of polymethacrylic acid, polyethylene glycol, styrenesulfonic acid, 2-acrylamido-2-methylpropane sulfonic acid (AMPS), vinylsulfonic acid, and vinylphosphonic acid.

7. The polishing slurry composition of claim 1, designed and formulated for polishing a semiconductor device, a display device, or both.

8. The polishing slurry composition of claim 1, designed and formulated for use at a speed of greater than or equal to 100 Å/min.

9. The polishing slurry composition of claim 1, designed and formulated for a degree of planarization of a surface of a target film after the target film is polished is less than or equal to 5%.

* * * * *